(12) United States Patent
Nakano et al.

(10) Patent No.: US 6,391,520 B1
(45) Date of Patent: May 21, 2002

(54) COMPOUNDS FOR PHOTORESIST AND RESIN COMPOSITION FOR PHOTORESIST

(75) Inventors: Tatsuya Nakano; Yoshinori Funaki, both of Hyogo (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/463,138

(22) PCT Filed: May 20, 1999

(86) PCT No.: PCT/JP99/02638

§ 371 Date: Mar. 20, 2000

§ 102(e) Date: Mar. 20, 2000

(87) PCT Pub. No.: WO99/61956

PCT Pub. Date: Dec. 2, 1999

(30) Foreign Application Priority Data

May 25, 1998 (JP) .......................................... 10-143535
Aug. 11, 1998 (JP) .......................................... 10-227336

(51) Int. Cl.$^7$ .......................... G03F 7/004; C07C 69/52
(52) U.S. Cl. .................... 430/270.1; 560/220; 526/281; 430/326
(58) Field of Search .............................. 430/270.1, 326; 560/220; 526/281; 585/352

(56) References Cited

U.S. PATENT DOCUMENTS 6,004,720 A * 12/1999 Takechi et al. .......... 430/270.1
6,235,851 B1 * 5/2001 Ishii et al. .................. 525/440

FOREIGN PATENT DOCUMENTS

| EP | 0663616 A2 | 7/1995 |
|----|------------|--------|
| EP | 0915077 A1 | 5/1999 |
| JP | 58-211181 | 12/1983 |
| JP | 63-307844 | 12/1988 |
| JP | 1-182303 | 7/1989 |
| JP | 4-39665 | 2/1992 |
| JP | 9-73173 | 3/1997 |
| JP | 10-83076 | 3/1998 |
| JP | 10-239847 | 9/1998 |
| WO | WO/81/03657 | 12/1981 |

OTHER PUBLICATIONS

Uetani, Y, et al. SPIE vol. 3333, Feb. 1998, 546–553.*
Novikov et al., "Synthesis and Polymerization of Unsaturated Derivatives of Adamantane", vol. 27, *Bulletin of the Academy of Sciences of the USSR. Div. Of Chemical Science*, 1978, pp. 2556–2558.

* cited by examiner

*Primary Examiner*—Rosemary Ashton
(74) *Attorney, Agent, or Firm*—Birch, Stewart, Kolasch & Birch, LLP

(57) ABSTRACT

The photoresist resin composition comprises a polymer having an adamantane skeleton represented by the following formula and a photoactive acid precursor:

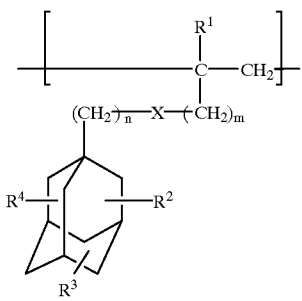

(1)

wherein $R^1$ represents a hydrogen atom or a methyl group; $R^2$, $R^3$, and $R^4$ are the same or different from each other, each representing a hydrogen atom, a halogen atom, an alkyl group, a hydroxyl group, a hydroxylmethyl group, a carboxyl group, a functional group which forms a hydroxyl group, a hydroxymethyl group or a carboxyl group by elimination with an acid; at least one of the substituents $R^2$ to $R^4$ is the functional group defined above; X represents an ester bond or an amide bond; and each of m and n is 0 or 1.

The above photoresist resin composition is highly resistant to an etching solution, solubilizable by irradiation with light, and capable of giving minute patterns.

8 Claims, No Drawings

COMPOUNDS FOR PHOTORESIST AND RESIN COMPOSITION FOR PHOTORESIST

TECHNICAL FIELD

The present invention relates to resin compositions for photoresists (resists) suitable for forming patterns (e.g., minute processing of semiconductors) by means of ultraviolet rays or far-ultraviolet rays (including excimer laser and so on), and to compounds for photoresists useful in obtaining the same.

BACKGROUND ART

Known as resists for semiconductors are photosensitive resin compositions containing an alkali-soluble novolak resin and a diazonaphthoquinone derivative. These resin compositions have been employed as positive resists utilizing the characteristic that a diazonaphthoquinone group is decomposed by irradiation with light to form a carboxyl group, rendering an alkali-insoluble resin composition alkali-soluble. Moreover, there is known a negative resist, that is a resist which becomes insoluble on exposure to light through a photo-crosslinking reaction in the presence of an azide compound or a photopolymerization reaction in the presence of a photopolymerization initiator.

However, these resists are opaque or inactive to light at a wavelength of 200 nm or shorter due to an aromatic ring contained in a resin and therefore not suitable as photoresists processed with an ArF excimer laser having a wavelength of 193 nm.

As a photoresist for ArF excimer laser, Japanese Patent Application Laid-Open No. 73173/1997 discloses a resin having an alicyclic hydrocarbon group such as adamantane and norbornane. Since this resin has no double bond in its ring, it is transparent or active to ArF excimer laser and the alicyclic hydrocarbon group thereof makes the resin more resistant to plasma gas dry-etching used in the minute processing of semiconductors.

Usually, the photoresist resins having an alicyclic hydrocarbon group are roughly classified into the groups: (1) copolymers having a monomer unit which becomes alkali-soluble by being cleaved by an acid and a non-leaving alicyclic hydrocarbon monomer unit; (2) copolymers having a unit which becomes alkali-soluble as a result of leaving of an alicyclic hydrocarbon group therefrom caused by an acid; and (3) resins having, in the main or side chain, an alicyclic hydrocarbon unit which becomes alkali-soluble by being decomposed by an acid, with the resultant resins themselves made alkali-soluble. Of these resins, resins of the group (3) are said to be preferable. However, it is difficult to make the resin (3) alkali-soluble because the adamantane skeleton is bulky, strongly hydrophobic, and stable toward an acid.

Accordingly, an object of the present invention is to provide a photoresist resin composition useful for forming minute patterns, of which the polymer itself can be solubilized by irradiation with light even when having an adamantane skeleton, and a photoresist compound useful for providing this resin composition.

Another object of the present invention is to provide a positive photoresist resin composition of simple formula which is highly resistant to etching (particularly, resistant to dry-etching) and from which can be made minute patterns with accuracy, and a photoresist compound useful for providing this resin composition.

DISCLOSURE OF INVENTION

The inventors of the present invention made intensive and extensive studies to achieve the above objects and found that, in a specific polymer having an adamantane skeleton used in combination at least with a photoactive acid generator (photoactive acid precursor), an acid generated from the photoactive acid precursor by irradiating the combination with light hydrolyzes the functional group of the polymer to give a hydrophilic group, thereby making possible development with water or an alkali. The present invention was accomplished based on the above findings.

The photoresist compound of the present invention can be expressed by the following formula (1a):

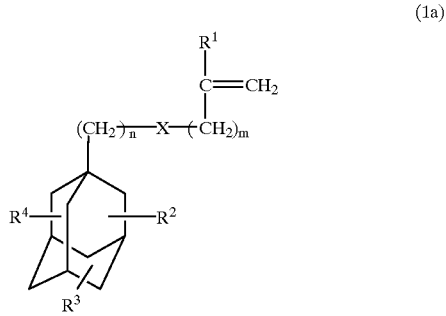

(1a)

wherein $R^1$ represents hydrogen atom or methyl group; $R^2$, $R^3$ and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, a hydroxylmethyl group or a carboxyl group by elimination with an acid; at least one of the groups $R^2$, $R^3$ and $R^4$ is the functional group mentioned above; X represents a connecting group (or a linker); and m and n individually represent 0 or 1.

In the photoresist compound, at least two of the substituents $R^2$ to $R^4$ are preferably groups selected from hydroxyl group, hydroxymethyl group, carboxyl group, and functional groups, and at least two of the substituents $R^2$ to $R^4$ are preferably substituents of different kinds selected from hydroxyl group, alkoxy groups-, hydroxyl group protected by acetilization or hemiacetalization, carboxyl group, and alkoxycarbonyl groups, and these substituents are different from each other. X may be an ester bond.

The photoresist resin composition of the present invention comprises a polymer having a unit shown by the following formula (1) and a photoactive acid precursor:

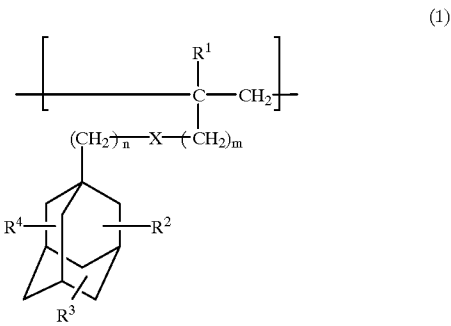

(1)

wherein $R^1$ represents hydrogen atom or methyl group; $R^2$, $R^3$ and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, a hydroxymethyl group or a carboxyl group by elimination with an acid; at least one of the groups $R^2$ to $R^4$ is the functional group described above; X represents a connecting group; and m and n individually represent 0 or 1.

The present invention further includes a process for forming a pattern, comprising a step of exposing a coating layer comprising the photoresist resin composition in a predetermined pattern (i.e., a step of patter-exposing a coating layer comprising the photoresist resin composition) and a step of developing the exposed coating layer to define a latent pattern.

BEST MODE FOR CARRYING OUT THE INVENTION

In the compound (1a) and the polymer (1) each having an adamantane skeltone defined above, halogen atoms include iodine, bromine, chlorine, and fluorine atoms. Alkyl groups include $C_{1-6}$ alkyl groups (particularly, $C_{1-4}$ alkyl groups) such as methyl, ethyl, propyl, isopropyl, butyl, and t-butyl. N-substituted amino groups include mono- or di-$C_{1-6}$alkylamino groups (preferably, mono- or di-$C_{1-4}$alkylamino groups).

Examples of the functional group which forms hydroxyl group, hydroxymethyl group or carboxyl group by elimination with an acid are hydroxyl group protected by a protective group, hydroxymethyl group protected by a protective group, and carboxyl group protected by a protective group. The protecting group functions as a dissolution-inhibitory modifying group for preventing the polymer from dissolving before being exposed to light.

Examples of the protective group for hydroxyl group or hydroxymethyl group are alkoxycarbonyl groups (e.g., $C_{1-4}$alkoxycarbonyl groups such as methoxycarbonyl, ethoxycarbonyl, and t-butoxycarbonyl groups); and benzyloxy group. Hydroxyl group or hydroxymethyl group may be protected by a protective group represented by the formula —CH(OR$^a$)R$^b$ (R$^a$ represents hydrogen atom or a $C_{1-6}$ alkyl group, and R$^b$ is a residue derived from an aldehyde, such as hydrogen atom, a $C_{1-6}$ alkyl group, and an aryl group) by means of hemiacetalization or acetalization.

Adamantane in which a hydroxyl group is protected by hemiacetalization or acetalization can be expressed by, e.g., the following formula:

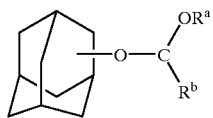

wherein R$^a$ and R$^b$ are the same as defined above.

Examples of an aldehyde usable for hemiacetalization or acetalization are aliphatic aldehydes (e.g., $C_{1-10}$ aldehydes such as formaldehyde, acetoaldehyde), aromatic aldehydes (e.g., benzaldehyde, anisaldehyde), and heterocyclic aldehydes (e.g., nicotinaldehyde, furfural).

As the protective group for carboxyl group, there may be exemplified alkoxy groups ($C_{1-6}$ alkoxy groups such as methoxy, ethoxy, and t-butoxy groups, particularly t-$C_{4-6}$ alkoxy groups), cycloalkyloxy groups (e.g., $C_{3-10}$cycloalkyloxy groups such as cyclobutyloxy, cyclopentyloxy, cyclohexyloxy, cycloheptyloxy, and cyclooctyloxy groups), aralkyloxy groups (e.g., benzyloxy group, p-methoxybenzyloxy, diphenylmethyloxy, benzhydryloxy groups), and N-hydroxysuccinimide group.

Preferred protective groups for hydroxyl group include alkoxycarbonyl groups (particularly, branched alkoxycarbonyl groups such as t-butoxycarbonyl group), and preferred protective groups for carboxyl group include alkoxy groups (e.g., branched alkyl groups such as t-butoxy group).

Of the substituents $R^2$ to $R^4$, it will be sufficient if at least one substituent is the above-described functional group which forms a hydrophilic group by the action of an acid, yet it is advantageous in improving solubility to water or an alkaline solution if two to three substituents are functional groups defined above. Incidentally, of the substituents $R^2$ to $R^4$, the rest of the substituents other than the functional group(s) in many cases represent(s) hydrogen atom, a $C_{1-2}$alkyl group, amino group, hydroxyl group, hydroxymethyl group, or carboxyl group.

Moreover, of the subsituents $R^2$ to $R^4$, the position at which a non-reactive atom (e.g., hydrogen atom, a halogen atom), a non-reactive group (e.g., an alkyl group) or a functional group substituent is not limited and may be any of the 2-, 3-, 4-, 5-, or 7-position of the adamanatane skeleton. However, in the formulae (1a) and (1), nitro group, amino group, N-substituted amino group, or the functional group which forms a hydrophilic group by elimination with an acid is usually bound at the 3-, 5-, or 7-position of the adamantane skeleton relative to the substitution position of the group —(CH$_2$)$_n$.

Incidentally, it is preferred that at least two of the groups $R^2$ to $R^4$ are substituents selected from hydroxyl group, hydroxymethyl group, carboxyl group, and the functional groups. Moreover, it is preferred that at least two of the groups $R^2$ to $R^4$ are substituents of different kinds (i.e., different from each other) selected from hydroxyl group, an alkoxy group, hydroxyl group protected by acetalization or hemiacetalization, carboxyl group and an alkoxycarbonyl group.

The connecting group X for connecting adamantane to a polymerizable unsaturated group usually has at least an ester bond or an amide bond. Ester bonds include —OC(=O)— and —C(=O)O—, and amide bonds include —CONH— and —NHCO— (e.g., the left end thereof is a moiety to be coupled with the adamantane skeleton). The connecting group X usually has an ester bond.

Typical examples of the connecting group X having a polymerizable unsaturated group are (meth)acryloyloxy group, (meth)acryloylamino group, (meth)acryloyloxy-$C_{2-10}$alkyloxycarbonyl group, allyloxycarbonyl group, and allylaminocarbonyl group.

The polymer having an adamantane skeleton shown by the formula (1) may be a homo- or copolymer of an adamantane-series monomer shown by the formula (1a) (photoresist compound), or a copolymer of an adamantane-series monomer of the formula (1a) and a copolymerizable monomer.

The adamantane-series monomer of the formula (1a) includes, as will be described hereinafter, (meth)acrylic monomers and allyl-series monomers.

As the copolymerizable monomer, there may be mentioned, for example, (meth)acrylic monomers [e.g., (meth)acrylic acid, (meth)acrylic acid $C_{1-10}$alkyl esters such as methyl (meth)acrylate, ethyl (meth)acrylate, butyl (meth)acrylate, hexyl (meth)acrylate, octyl (meth)acrylate, and 2-ethylhexyl (meth)acrylate; (meth)acrylic acid hydroxy$C_{2-6}$alkyl esters such as 2-hydroxyethyl (meth)acrylate; glycidyl (meth)acrylate], styrenic monomers (e.g., styrene), vinyl ester-series monomers (e.g., vinyl acetate), carboxyl group-containing monomers (e.g., maleic anhydride, itaconic acid), monomers having a lactone skeleton, and monomers having an alicyclic hydrocarbon ring.

Examples of the monomer having a lactone skeleton are (meth)acrylic monomers shown by the following formulae:

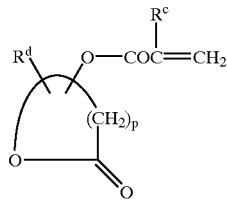

especially

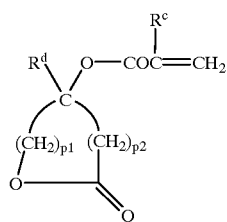

wherein $R^c$ represents hydrogen atom or methyl group; $R^d$ represents hydrogen atom or a $C_{1-4}$ alkyl group; p is an integer of about 2 to 15; p1 and p2 each represents an integer of about 0 to 8; and p1+p2=about 1 to 14, and allyl monomers corresponding thereto.

$C_{1-4}$ alkyl groups designated by $R^d$ include methyl group, ethyl group, propyl group, isopropyl group, and butyl-, isobutyl-, and t-butyl groups. $R^d$ is usually hydrogen atom or methyl group. p is usually about 3 to 10, particularly about 3 to 6. Moreover, each of p1 and p2 is usually an integer of about 0 to 8, and p1+p2=about 2 to 9 (preferably, about 2 to 5). The number of (meth) acryloyloxy groups, allyloxy groups, or the groups $R^d$ and the substitution position of each group are not particularly limited, and such groups may substitute at suitable positions on the lactone ring.

Examples of a monomer having an alicyclic hydrocarbon ring are (meth)acrylates having a monocyclic hydrocarbon ring and (meth) acrylates having a polycyclic hydrocarbon ring (e.g., a spirohydrocarbon ring, a ring-assembly hydrocarbon ring, a condensed ring-type hydrocarbon ring, crosslinked ring-type hydrocarbon ring). Exemplified as a (meth)acrylate having a monocyclic hydrocarbon ring are $C_{4-10}$cycloalkyl (meth)acrylates such as cycloheptyl (meth)acrylate, cyclohexyl (meth)acrylate, cyclopentyl (meth)acrylate, and cyclooctyl (meth)acrylate. Examples of a (meth)acrylate having a spiro hydrocarbon ring are (meth) acrylates having a Spiro $C_{8-16}$ hydrocarbon ring such as spiro[4,4]nonyl (meth)acrylate, spiro[4,5]decanyl (meth) acrylate, and spirobicyclohexyl (meth)acrylate. Examples of a (meth)acrylate having a ring-assembly hydrocarbon ring are those in which the ring-assembly hydrocarbon ring is a $C_{5-12}$cycloalkane ring, such as bicyclohexyl (meth)acrylate. Exemplified as a (meth)acrylate having a condensed ring-type hydrocarbon ring are those having a ring condensed with a 5 to 8-membered ring, such as perhydronaphthyl (meth)acrylate and perhydroanthryl (meth)acrylate.

As the (meth)acrylate having a crosslinked alicyclic hydrocarbon ring, there may be mentioned, for example, (meth)acrylates having a bicyclic hydrocarbon ring, such as bornyl (meth)acrylate, norbornyl (meth)acrylate, isobornyl (meth)acrylate, and isobornyloxyethyl (meth)acrylate; (meth)acrylates having a tricyclic hydrocarbon ring such as dicyclopentadienyl (meth)acrylate, dicyclopentenyl (meth) acrylate, dicyclopentenyloxyalkyl (meth)acrylate, tricyclodecanyl (meth)acrylate (tricyclo[5.2.1.0$^{2,6}$]decanyl (meth) acrylate), tricyclodecanyloxyethyl (meth)acrylate, tricyclo [4.3.1.1$^{2,5}$]undecanyl, and adamantyl (meth)acrylate; and (meth) acrylates having a tetracyclic hydrocarbon ring, such as tetracyclo[4.4.0.1.$^{2,5}$.1$^{7,10}$]dodecane, perhydro-1,4-methano-5,8-methanonaphthalene.

These copolymerizable monomers may have a variety of substituents. Moreover, these can be used either singly or in combination.

Preferred as the copolymerizable monomer are monomers having an alicyclic hydrocarbon ring (particularly, monomers having a crosslinked ring-type hydrocarbon ring such as bornane, norbornane, and adamantane skeleton. A preferred copolymerizable monomer may have the same substituent(s) or functional group(s) as that of the compound shown by the formula (1a). Particularly, monomers having an alicyclic hydrocarbon ring substituted by at least one substituent selected from hydroxyl group, hydroxymethyl group, and carboxyl group are preferred.

Such copolymerizable monomers include adamantane-series monomers represented by the following formula (1b):

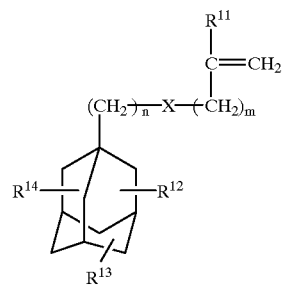

(1b)

wherein $R^{11}$ represents a hydrogen atom or a methyl group; $R^{12}$, $R^{13}$, and $R^{14}$ are the same or different from each other, each representing a hydrogen atom, a halogen atom, an alkyl group, a nitro group, an amino group, an N-substituted amino group, a hydroxyl group, a hydroxymethyl group, an oxo group, a carboxyl group, or a functional group which forms a hydroxyl group, a hydroxymethyl group, or a carboxyl group by elimination with an acid; and X, m, and n have the same meanings as defined above.

The atom(s) and group(s) designated by the substituents $R^{11}$, $R^{12}$, $R^{13}$ and $R^{14}$ correspond to those designated by $R^1$, $R^2$, $R^3$ and $R^4$ in the formula (1a).

In the formula (1b), it is preferred that at least one of the groups $R^{12}$, $R^{13}$, and $R^{14}$ is a group selected from hydroxyl group, hydroxymethyl group, oxo group, and carboxyl group.

The proportion of the monomer having an alicyclic hydrocarbon ring [particularly, the monomer having a crosslinked ring-type hydrocarbon ring typified by the monomer represented by the formula (1b)] to the adamantane-series monomer shown by the formula (1a) can be selected from the range of, relative to 100 parts by weight of the latter, about 0 to 200 parts by weight, preferably about 10 to 150 parts by weight, and more preferably about 20 to 100 parts by weight.

The proportion of the adamantane-series monomer (1a) constituting the copolymer is, for example, about 10 to 100% by weight, preferably about 25 to 100% by weight, and more preferably about 30 to 100% by weight (e.g., 50 to 100% by weight).

The present invention is characterized in that the combination of a polymer of a compound of the formula (1a), i.e., a polymer having an adamantane skeleton of the formula (1) and a photoactive acid precursor enables the solubilization of the polymer by irradiation with light.

As the photoactive acid precursor (generator), use can be made of conventional compounds that efficiently generate acids by being exposed to light, such as diazonium salts, iodonium salts, sulfonium salts, oxathiazole derivatives, s-triazine derivatives, imide compounds, oxime sulfonate, diazonaphthoquinone, sulfonic acid esters [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, 1-phenyl-1-(4-methylphenyl)sulfonyloxymethyl-1-hydroxy-1-benzoylmethane, disulfone derivatives (e.g., diphenyldisulfone), benzointosylate] and Lewis acid salts (e.g., triphenylsulfonium hexafluoroantimony $(Ph)_3S^+$ $SbF_6^-$, triphenylsulfonium hexafluorophosphate $(Ph)_3S^+$ $PF_6^-$, triphenylsulfonium methanesulfonyl $(Ph)_3S^+$ $CH_3SO_3^-$, diphenyliodohexafluorophosphate). The abbreviation "Ph" represents phenyl group.

These photoactive acid precursors can be used either singly or in combination.

The amount of the photoactive acid precursor can be selected from within the range of about 0.1 to 30 parts by weight, preferably about 1 to 25 parts by weight, and more preferably about 5 to 20 parts by weight relative to 100 parts by weight of the adamantane unit of the formula (1), depending on the strength of an acid formed by irradiation with light and the amount of the adamantane-series monomer (1a).

The photoresist resin composition may contain an alkali-soluble component such as an alkali- soluble resin (e.g., novolak resins, phenolic resins, carboxyl group-containing resins), a colorant (dye), an organic solvent, etc. Examples of the organic solvent are hydrocarbons, halogenated hydrocarbons, alcohols, esters, ketones, ethers, cellosolves (e.g., methyl cellosolve, ethyl cellosolve, butyl cellosolve), carbitols, glycol ether esters (e.g., mono- or polyalkylene glycol monoalkylether esters, cellosolve acetates such as ethyl cellosolve acetate, propylene glycol monomethyl ether acetate, propylene glycol monoethyl ether acetate), and mixed solvents thereof.

Moreover, impurities may optionally be removed from the photoresist resin composition by a conventional separation-purification means such as a filter.

The photoresist resin composition of the present invention can be prepared by mixing the above-described polymer and the photoactive acid precursor. This photoresist resin composition is applied (or coated on) to a base or substrate and dried. The coating layer so formed (resist film) is then exposed to light patternwise (i.e., the coating layer is pattern-exposed) and developed to give the corresponding pattern. This photoresist resin composition has high sensitivity to light and gives a pattern of high resolution. Usually, a minute pattern can be formed with high accuracy and precision by exposing the coating layer formed on the base through a given mask to form a pattern (or define a latent pattern) and then developing the exposed layer.

The base can be selected according to the intended use of the photoresist resin composition and may be a silicon wafer, metal, plastics, glass, ceramics, etc. The coating method for the photoresist resin composition may be a conventional one typified by spin coating and roll coating, depending on the intended use. The thickness of the coating layer of the photoresist resin composition can suitably be selected from within the range of, e.g., about 0.1 to 20 $\mu$m.

Rays of various wavelengths such as ultraviolet ray and X-ray are available for the exposure, and g-line, i-line, excimer lasers (e.g., XeCl, KrF, KrCl, ArF, ArCl) are usually employed when forming resists for semiconductors.

The exposure energy can be selected from within the range of, e.g., about 0.1 to 50 mj/cm$^2$, preferably about 1 to 30 mJ/cm$^2$.

The photoactive acid precursor generates an acid when irradiated with light, and the generated acid eliminates the protective group from the functional group, forming a hydroxyl group or carboxyl group conducive to solubilizability. As a result, a predetermined pattern can be formed by developing the coating layer with a water-developing agent or an alkaline developing agent (or developer). Particularly, since the photoresist resin composition of the present invention has an adamantane skeleton, the resin composition does not swell with a developer so much and therefore is capable of giving circuit patterns with accuracy and precision. In addition to the above, the photoresist resin composition is highly resistant to etching (particularly, dry-etching), enabling the formation of minute circuit patterns with precision.

The present invention has a variety of uses and can be used as a material for circuit formation (e.g., resists for semiconductor production, printed wiring boards), an imaging material (e.g., printing plate materials, materials for relief printing) and so on.

Incidentally, the adamantane-series monomers represented by the formulae (1a) and (1b) can be obtained in accordance with a conventional process, e.g., by esterifying or amidating a compound shown by the following formula (1c):

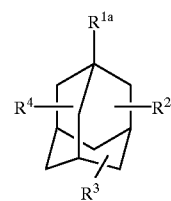

(1c)

wherein $R^{1a}$ is a reactive group selected from hydroxyl group, hydroxylmethyl group, carboxyl group, amino group, and a reactive group derived therefrom; and $R^2$, $R^3$ and $R^4$ have the same meanings as defined above
and at least one polymerizable unsaturated compound (1d) selected from alcohols having a polymerizable unsaturated bond, carboxylic acids having a polymerizable unsaturated bond, amines, and their reactive derivatives having a polymerizable unsaturated bond. This reaction may be carried out in the presence of a catalyst of a compound containing a Group 3 element of the Periodic Table of Elements.

In the adamantane derivative (1c), the position at which a reactive group substitutes is not particularly limited and may be the methylene site, but usually a methine carbon site of the adamantane moiety (i.e., the 1-position, 3-position, 5-position, or the 7-position).

Examples of the polymerizable unsaturated group of the polymerizable unsaturated compound (1d) are vinyl group, 1-propenyl group, isopropenyl group, and allyl group. The preferred unsaturated unsaturated group is a group having an α,β-ethylenically unsaturated bond (e.g., vinyl group, isopropenyl group, allyl group).

Of polymerizable unsaturated compounds (1d), as an alcohol having a polymerizable unsaturated bond, there may be exemplified allyl alcohols, hydroxyalkyl (meth)acrylates [e.g., hydroxy$C_{2-6}$alkyl (meth)acrylates such as 2-hydroxyethyl (meth)acrylate, 2-hydroxypropyl (meth)acrylate, 3-hydroxypropyl (meth)acrylate, 4-hydroxybutyl (meth)acrylate, 6-hydroxyhexyl (meth)acrylate] and (poly)oxy$C_{2-4}$alkylene glycol mono(meth)acrylates [e.g., diethylene glycol mono(meth)acrylate, triethylene glycol mono(meth)acrylate, polyethylene glycol mono(meth)acrylate, dipropylene glycol mono(meth)acrylate, tripropylene glycol mono(meth)acrylate, polypropylene glycol mono(meth)acrylate, polyoxytetramethylene glycol mono (meth) acrylate]. Examples of reactive derivatives of these alcohols are allyl halides (e.g., allyl chloride, allyl bromide).

Carboxylic acids having a polymerizable unsaturated bond include, for example, monocarboxylic acids such as (meth)acrylic acid and crotonic acid; polycarboxylic acids such as maleic acid, fumaric acid, and itaconic acid; and monoalkyl esters of these polycarboxylic acids. Reactive derivatives of these carboxylic acids are, e.g., acid anhydrides [e.g., (meth)acrylic acid anhydride, maleic anhydride] and compounds having a leaving group. Reactive derivatives of carboxylic acids having a leaving group include acid halides [e.g., (meth)acryloyl chloride, (meth)acryloyl bromide], carboxylic acid alkyl esters [e.g., carboxylic acid $C_{1-6}$alkyl esters such as methyl (meth)acrylate, ethyl (meth)acrylate, propyl (mety)acrylate, butyl (meth)acrylate, isobutyl (meth)acrylate, t-butyl (meth)acrylate], carboxylic acid alkenyl esters [e.g., carboxylic acid $C_{2-10}$alkenyl esters such as vinyl (meth)acrylate, allyl (meth)acrylate, 1-propenyl (meth)acrylate, isopropenyl (meth)acrylate, 1-butenyl (meth)acrylate, 2-butenyl (meth)acrylate, 3-butenyl (meth)acrylate, 2-pentenyl (meth)acrylate], carboxylic acid alkynyl esters [e.g., carboxylic acid $C_{2-10}$alkynyl esters such as ethynyl (meth)acrylate and propynyl (meth)acrylate], carboxylic aid aryl esters [e.g., phenyl (meth)acrylate], carboxylic acid cycloalkyl esters [e.g., carboxylic acid $C_{3-10}$cycloalkyl esters such as cyclohexyl (meth)acrylate], carboxylic acid aralkyl esters [carboxylic acid phenyl-$C_{1-4}$alkyl esters such as benzyl (meth)acrylate].

Preferred reactive derivatives include carboxylic acid halides, carboxylic acid $C_{1-6}$ lower alkyl esters, carboxylic acid $C_{2-6}$alkenyl esters, and carboxylic acid $C_{2-6}$alkynyl esters. Particularly, the use of a carboxylic acid halide or a carboxylic acid $C_{2-6}$alkenyl ester induces an exchange reaction of the leaving group, enabling the formation of a corresponding polymerizable adamantane derivative with high selectivity and yield while hindering side reactions such as addition polymerization.

Examples of an amine having a polymerizable unsaturated bond are compounds having an unsaturated double bond, such as allylamine and diallylamine.

Preferred compounds having a polymerizable unsaturated bond include carboxylic acids and reactive derivatives thereof, with carboxylic acids and reactive derivatives thereof having an α,β-ethylenically unsaturated double bond particularly preferred [e.g., carboxylic acid halides, carboxylic acid $C_{1-4}$ lower alkyl esters, carboxylic acid $C_{2-4}$alkenyl esters]. Useful organic carboxylic acids are those having an α,β-ethylenically unsaturated double bond (particularly, acrylic acid, methacrylic acid).

The esterification or amidation reaction may be carried out in accordance with a conventional method, e.g., in the presence of a suitable catalyst (e.g., acid catalyst). To provide the polymerizable adamantane derivative at a higher efficiency and in a higher yield, it is advantageous that the esterification reaction (including leaving group-exchange reactions such as transesterification) or amidation reaction of the adamantane derivative (1c) and the polymerizable unsaturated compound (1d) is carried out in the presence of a catalyst of a Group 3 element-containing compound. In a reaction using such catalyst, the formation of, e.g., an amine hydrochloride can be inhibited, and the use of a carboxylic acid $C_{1-4}$ lower alkyl ester or a carboxylic acid $C_{2-4}$alkenyl ester prevents the object compound from being contaminated with a halide component. Further, since a compound of low boiling point (e.g., the esters mentioned above) is available as the reaction component, i.e., the polymerizable unsaturated compound (1d), treatment after the reaction can be made easy and the isolation yield is largely improved.

As for the catalyst comprised of a Group 3 element-containing compound, Group 3 elements of the Periodic Table of Elements include rare earth elements [e.g., scandium, yttrium, lanthanoid-series elements (e.g., lanthanum, cerium, praseodymium, neodymium, promethium, samarium, europium, gadolinium, terbium, dysprosium, holmium, erbium, thulium, ytterbium, lutetium)] and actinoid-series elements (e.g., actinium). Preferred Group 3 elements include rare earth elements such as scandium, yttrium, and lanthanoid-series elements (e.g., samarium, gadolinium, ytterbium). Particularly, samarium is has high catalytic activity.

In the Group 3 element-containing compound, the valence of the Group 3 element is not particularly limited and, in many cases, may be about divalent to quadrivalent, particularly divalent or trivalent.

Insofar as the above-described Group 3 element-containing compound is catalytically active, the species thereof is not particularly limited and may be a simple metal (elemental metal), an inorganic compound (e.g., halides, oxides, double oxides, phosphorus compounds, nitrogen compounds), or a compound or a complex with an organic compound (e.g., organic acids). Usually, the Group 3 element-containing compound is a hydroxide, an oxo acid salt, an organic acid salt, an inorganic acid salt, a halide, or a coordiation compound (complex). The complex may be a π-complex typified by a metallocene compound. Moreover, the Group 3 element-containing compound may be a complex metal compound (double salt compound) with other metals. The catalyst can be used either singly or in combination.

Hereinafter, although the catalytic component will be described in further detail with a samarium compound taken as an example, other Group 3 element-containing compounds corresponding to samarium compounds are also usable with effectiveness.

Hydroxides include, e.g., samarium (II) hydroxide and samarium (III) hydroxide, and the metal oxide includes samarium (II) oxide, samarium oxide (III), and the like.

As an organic acid salt, there may be mentioned salts of organic acids, such as organic carboxylic acids (e.g., monocarboxylic acids, polycarboxylic acids), hydroxycarboxylic acids, thiocyanic acid, sulfonic acids (e.g., alkylsulfonic acid, benzenesulfonic acid, arylsulfonic acid). As an inorganic acid salt, there may be exemplified nitrates, sulfates, phosphates, carbonates, and perchlorates. Concrete examples of the organic acid salt or inorganic acid salt are samarium (II) acetate, samarium (III) acetate, samarium (II) trichloroacetate, samarium (III) trichloroacetate, samarium (II) trifluoroacetate, samarium (III) trifluoroacetate, samarium (II) trifluoromethanesulfonate (i.e., samarium (II) triflate), samarium (III) trifluoromethanesulfonate (i.e., samarium (III) triflate), samarium (II) nitrate, samarium (II) sulfate, samarium (II) phosphate, and samarium (II) carbonate.

Exemplified as a halide are fluorides, chlorides (e.g., samarium (II) chloride, samarium (III) chloride), bromides (e.g., samarium (II) bromide, samarium (III) bromide) and iodides (e.g., samarium (II) iodide, samarium (III) iodide).

Examples of a ligand constituting the complex are OH (hydroxo), alkoxy groups, acyl groups, alkoxycarbonyl groups, acetylacetonato, cyclopentadienyl, $C_{1-4}$alkyl-substituted cyclopentadienyls (e.g., $C_{1-2}$alkyl-substituted cyclopentadienyls such as pentamethylcylopentadienyl), dicyclopentadienyl, $C_{1-4}$alkyl-substituted dicyclopentadienyls (e.g., $C_{1-2}$alkyl-substituted dicyclopentadienyls such as pentamethyldicyclopentadienyl), halogen atoms, CO, CN, oxygen atom, $H_2O$ (aquo), phosphorus compounds such as phosphine, nitrogen-containing compounds such as $NH_3$ (ammine), NO, $NO_2$ (nitro), $NO_3$ (nitrato), ethylenediamine, diethylenetriamine, pyridine and phenanthroline. In the complex or a complex salt, the same or different ligands may be coordinated singly or in combination of two or more.

Of the above complexes, as a samallocene-type complex, there may be exemplified diacetylacetonato samarium (II), triacetylacetonato samarium (III), dicyclopentadienyl samarium (II), tricyclopentadienyl samarium (III), dipentamethylcyclopentadienyl samarium (II), and tripentamethylcyclopentadienyl samarium (III).

Incidentally, when the Group 3 element-containing compound [a samarium compound such as a divalent samallocene-type complex [$(C_5Me_5)_2Sm$; PMSm] having a pentamethylcyclopentadienyl ligand which is highly electron-donative], a halide of samarium, alkoxide, hydroxide, etc] is used as the catalyst, not only an amidation reaction but also an estrification reaction which is a disadvantageous one in equilibrium reactions proceeds at a reaction efficiency higher than in the case with a Lewis acid catalyst or a protonic acid catalyst while inhibiting side reactions. Therefore, the catalyst is useful in forming the polymerizable adamantane derivative (1) by utilizing a leaving group-exchange reaction such as transesterifiaction.

The catalyst of a Group 3 element-containing compound may be homogeneous or heterogeneous. Moreover, the catalyst may be a solid catalyst in which a catalytic component comprised of a Group 3 element-containing compound is supported on a carrier. As for the carrier, in many cases, a porous carrier such as activated carbon, a zeolite, silica, silica-alumina, bentonite is used. As for the amount of the catalytic component supported thereon, the Group 3 element-containing compound is about 0.1 to 50 parts by weight, preferably about 0.5 to 30 parts by weight, and more preferably about 1 to 20 parts by weight relative to 100 parts by weight of the carrier.

The amount of the catalyst comprised of a Group 3 element-containing compound can suitably be selected from a wide range of, e.g., about 0.1 mol % to 1 equivalent, preferably 0.5 to 50 mol %, and more preferably about 1 to 25 mol % (e.g., 5 to 20 mol %) relative to the adamantane derivative (1c).

It is advantageous that the esterification or amidation is carried out in the presence of an oxime. The oxime is aldoxime or ketoxime, and either will do. Examples of the oxime are aliphatic oximes such as 2-hexanone oxime, alicyclic oximes such as cyclohexanone oxime, and aromatic oximes such as acetophenone oxime, benzophenone oxime, and benzyl dioxime.

The amount of the oxime can suitably be selected from a wide range of, e. g., about 0.1 mol % to 1 equivalent, preferably about 1 to 50 mol %, and more preferably about 5 to 40 mol % (e.g., 5 to 30 mol %) relative to the adamantane derivative (1c).

As for the proportions of the adamantane derivative (1c) and the polymerizable unsaturated compound (1d), the amount of the polymerizable unsaturated compound (1d) relative to 1 equivalent of the adamantane derivative (1c) (i.e., the weight of the adamantane derivative per hydroxyl group, carboxyl group, amino group, or a reactive derivative group thereof) is about 0.5 to 5 mole, preferably about 0.8 to 5 mole, and particularly 1 mole or more (e.g., 1 to 3 mole, particularly 1 to 1.5 mole). Since the esterification reaction is an equilibrium reaction, the larger the amount of the polymerizable unsaturated compound (1d) is, the more advantageously the reaction proceeds, but there is no need to use the polymerizable unsaturated compound (1d) much in excess because the catalytic activity of the catalyst is significantly high. Particularly, in the case of a reaction involving. a combination reactants which is disadvantageous in view of reaction equilibrium, when the above-mentioned alkenyl ester having a vinylic leaving group (e.g., vinyl ester) is used as the polymerizable unsaturated compound (1d), 1 mole or less of the compound (1d) (e.g., 0.4 to 1 mole, preferably about 0.5 to 1 mole) per 1 equivalent of leaving group of the adamantane derivative (1c) sometimes allows the reaction to rather readily proceed, producing good results.

As compared to a process using an acid halide such as (meth) acrylic acid chloride in which the reaction heat is large, in the process using the catalyst, since the reaction heat is small, the reaction smoothly proceeds even if the amount of a solvent is small and provides the object compound in high yield.

The esterification or amidation reaction can be carried out in the presence or absence of a solvent inert to the reaction and, as the reaction solvent, there may be exemplified aliphatic hydrocarbons, alicyclic hydrocarbons, aromatic hydrocarbons, ketones, ethers, aprotic polar solvents such as amides, N-methylpyrrolidone and nitriles, and mixed solvents thereof. The polymerizable unsaturated compound (1d) also can be used as the reaction solvent.

Of adamantane derivatives represented by the formula (1c), compounds having a plurality of hydroxyl groups or carboxyl groups are highly hydrophilic, and the use of an esterification reaction solvent commonly employed (e.g., hydrophobic solvents such as toluene) tends to bring the reaction system heterogeneous. Therefore, in the case where an adamantane derivative of high hydrophilicity is used, preferred as the solvent is a hydrophilic solvent (e.g., ketones such as acetone and methyl ethyl ketone, ethers such as dioxane, diethyl ether, tetrahydrofuran, aprotic polar solvents) or a mixed solvent of a hydrophilic solvent and a hydrophobic solvent (e.g., aliphatic, alicyclic, or aromatic hydrocarbons).

Since the above-described reaction is an equilibrium reaction, for acceleration of the reaction, it is advantageous that reaction inhibiting component(s) such as leaving component (s) is (are) readily removed f rom the reaction system. The removal of the leaving component(s) is advantageously carried out by using a solvent of high boiling point (e.g., an organic solvent having a boiling point of about 50 to 120° C., particularly about 60 to 115° C.) or an azeotropic solvent (e.g., hydrocarbons listed above).

The reaction temperature for estrification or amidation can be selected from the range of, e.g., about 0 to 150° C.

and preferably about 25 to 120° C. The use of the above-described catalyst of a Group 3 element-containing compound enables highly efficient formation of a polymerizable adamantane derivative even under mild conditions, and the reaction temperature may be, e.g., about 0 to 150° C., preferably about 10 to 100° C., and more preferably about 20 to 80° C. Particularly, the use of the above-mentioned organic carboxylic acid alkenyl ester as the polymerizable unsaturated compound (1d) enables the reaction to smoothly proceed under such mild conditions as a temperature of about 2.0 to 50° C. The reaction can be carried out either under pressure or applied pressure. Moreover, the reaction is conducted in accordance with a conventional method, for example in a batch system, semi-batch system, or a continuous system.

Compounds typically represented by the formulae (1a) and (1b) are, e.g., polymerizable adamantane derivatives having an ester bond [e.g., (meth)acrylates such as 1-(meth)acryloyloxy-3,5-dihydroxyadamantane, 1-(meth)acryloyloxy-3,5,7-trihydroxyadamantane, 1-(meth)acryloyloxy-3,5-dicarboxyadamantane, 1-(meth)acryloyloxy-3,5,7-tricarboxyadamantane; adamantanes having a (meth)acryloyloxy-$C_{2-10}$alkyloxy group, such as 1-[(2-(meth)acryloyloxyethyl)oxycarbonyl]-3,5-dihydroxyadamantane, 1-[(2-(meth)acryloyloxyethyl)oxycarbonyl]-3,5,7-trihydroxyadamantane, 1-[(2-(meth)acryloyloxyethyl)oxycarbonyl]-3,5-dicarboxyadamantane, 1-[(2-(meth)acryloyloxyethyl)oxycarbonyl]-3,5,7-tricarboxyadamantane; allylesters such as 1-(allyloxycarbonyl)-3,5,7-trihydroxyadamantane, 1-(allyloxycarbonyl)-3,5,7-tricarboxyadamantane]; polymerizable adamantane derivatives having an amide bond [e.g., (meth)acrylamides such as 1-[(meth)acryloylamino]-3,5,7-trihydroxyadamantane, 1-[(meth)acryloylamino]-3,5,7-tricarboxyadamantane], and compounds protected by a protective group that are corresponding to the compounds listed above.

After the reaction is complete,.-these polymerizable adamantane derivatives (1a) and (1b) can easily be separated and purified in accordance with a conventional process, e.g., through a separation step such as filtration, condensation, distillation, extraction, crystallization and recrystallization, column chromatography, or by a mixed separation means thereof.

Production Process of Adamantane Derivative (1c)

The adamantane derivative (1c) as the starting material. of the polymerizable adamantane derivatives (1a) and (1b) can be prepared by introducing at least one reactive group selected from hydroxyl group, carboxyl group, amino group, and a reactive derivative group thereof into an adamantane.

As an adamantane (substrate), there may be exemplified adamantane, alkyl group-containing adamantanes, hydroxyl group-containing adamantanes that may be protected by a protective group [e.g., hydroxyl group-containing adamantanes, alkoxy group-containing adamantanes, acyloxy group-containing adamantanes, alkoxycarbonyloxy group-containing adamantanes, carbamoyloxy group-containing adamantanes that may have a substituent], carboxyl group-containing adamantanes that may be protected by a protective group [e.g., carboxyl group-containing adamantanes, alkoxycarbonyl group-containing adamantanes, carbamoyloxy group-containing adamantanes that may have a substituent], nitro group-containing adamantanes, amino group-containing adamantanes that may be protected by a protective group (e.g., amino group-containing adamantanes, alkoxycarbonylamino group-containing adamantanes, acylamino group-containing adamantanes), N-substituted amino group-containing adamantanes (e.g., $C_{1-6}$acylamino group-containing adamantanes, mono- or di$C_{1-4}$alkylamino group-containing adamantanes), and hydroxymethyl group-containing adamantanes that may be protected by a protective group.

As adamantanes, commercially available ones may be used, and into which may be introduced a reactive group or substituent in accordance with the following method.

Hydroxyl Group-containing Adamantane Derivative

Of adamantane derivatives shown by the formula (1c), a compound having a hydroxyl group can be obtained in accordance with a conventional oxidation process, such as an oxidation process employing nitric acid or chromic acid, an oxidation-by-oxygen process employing a cobalt salt as catalyst, a biochemical oxidation process. or by introducing a halogen atom (e.g., bromine atom) into an adamantane and then introducing a hydroxyl group by hydrolyzing with an inorganic salt such as silver nitrate or silver sulfate. In a preferred process, a hydroxyl group-containing adamantane derivative is formed by oxidizing a substrate corresponding to the formula (1c) with oxygen in the presence of an oxidation catalyst comprised of a compound having an imide unit shown by the following formula (2) (hereinafter, sometimes simply referred to as an imide compound), or an oxidation catalyst comprised of the imide compound (2) and a co-catalyst:

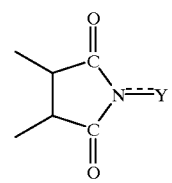

(2)

wherein Y is an oxygen atom or a hydroxyl group.

A preferred oxidation catalyst is represented by the following formula (3):

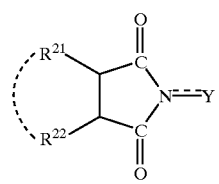

(3)

wherein $R^{21}$ and $R^{22}$ are the same or different from each other, each representing a hydrogen atom, a halogen atom, an alkyl group, an aryl group, acycloalkyl group, ahydroxyl group, an alkoxyl group, a carboxyl group, an alkoxycarbonyl group, an acyl group; $R^{21}$ and $R^{22}$ may bond together to form a double bond or aromatic or non-aromatic ring. The aromatic or non-aromatic ring constituted of $R^{21}$ and $R^{22}$ may have at least one imide unit of the formula (2). The nitrogen atom "N" and the substituent "Y" is linked by a single bond or double bond. Y has the same meaning as defined above.

Imide Compound (2)

Of imide compounds shown by the formula (2), in a compound shown by the formula (3), halogen atoms designated by the substituents $R^{21}$ and $R^{22}$ include iodine, bromine, chlorine and fluorine atoms. Alkyl groups include, for example, straight- or branched chain $C_{1-10}$alkyl groups (preferably $C_{1-6}$ lower alkyl groups, particularly $C_{1-4}$ lower alkyl groups) such as methyl, ethyl, propyl, isopropyl, butyl, isobutyl, s-butyl, and t-butyl. Aryl groups include phenyl group and naphthyl group. Cycloalkyl groups include cyclopentyl, cyclohexyl, and cyclooctyl groups. Alkoxy groups include $C_{1-10}$alkoxy groups (preferably $C_{1-6}$ lower alkoxy groups, particularly $C_{1-4}$alkoxy groups) such as methoxy, ethoxy, propoxy, isopropoxy, butoxy, isobutoxy, and t-butoxy.

Alkoxycarbonyl groups include $C_{1-10}$alkoxy-carbonyl groups (preferably, $C_{1-6}$ lower alkoxy-carbonyl groups, particularly $C_{1-4}$ lower alkoxy-carbonyl groups) such as methoxycarbonyl, ethoxycarbonyl, propoxycarbonyl, isopropoxycarbonyl, butoxycarbonyl, isobutoxycarbonyl, and t-butoxycarbonyl.

Acyl groups include $C_{1-6}$ acyl groups such as formyl, acetyl, propionyl, butyryl, isobutyryl, valeryl, isovaleryl, and pivaloyl.

The substituents $R^{21}$ and $R^{22}$ may be the same or different from each other. In the formula (3), $R^{21}$ and $R^{22}$ may bond together to form a double bond or an aromatic or non-aromatic ring. A preferred aromatic or non-aromatic ring may be a 5 to 12-membered, particularly about 6 to 10-membered ring. Such a ring may be a heterocyclic ring or a condensed heterocyclic ring, yet a hydrocarbon ring in many cases. Such rings include non-aromatic alicyclic rings (e.g., cycloalkane rings which may have a substituent, such as cyclohexane ring; cycloalkene rings which may have a substituent, such as cyclohexene ring), non-aromatic bridged (cross-linked) rings (e.g., bridged hydrocarbon rings which may have a substituent, such as 5-norbornene ring), and aromatic rings which may have a substituent, such as benzene ring and naphthalene ring. In many instances, the ring is practically an aromatic ring.

The aromatic or non-aromatic ring constituted of $R^{21}$ and $R^{22}$ may have about zero to three (preferably, 0 to 2) imide units of the formula (2).

Preferred imide compounds include compounds shown by the following formula;

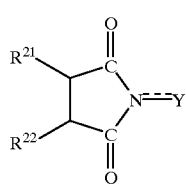

(2a)

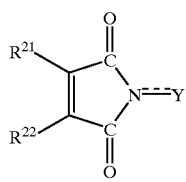

(2b)

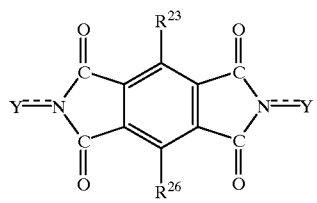

(2c)

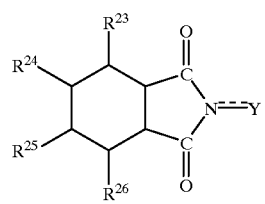

(2d)

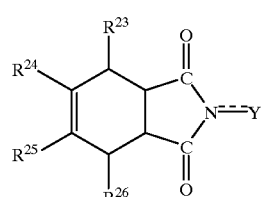

(2e)

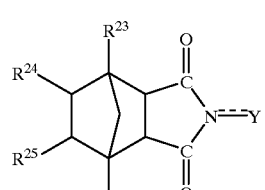

(2f)

wherein $R^{23}$ to $R^{26}$ are the same or different from each other, each representing a hydrogen atom, an alkyl group, a hydroxyl group, an alkoxy group, a carboxyl group, an alkoxycarbonyl group, an acyl group, a nitro group, a cyano group, an amino group or a halogen atom; and $R^{21}$, $R^{22}$ and Y have the same meanings as defined above.

As for the substituents $R^{23}$ to $R^{26}$, alkyl groups include alkyl groups similar to those exemplified above, particularly $C_{1-6}$alkyl groups. Alkoxy groups include the same alkoxy groups as mentioned above, in particular lower $C_{1-4}$alkoxy groups. Alkoxycarbonyl groups include the same alkoxycarbonyl groups as exemplified above, particularly $C_{1-4}$alkoxy-carbonyl groups. As an acyl group, there may be mentioned acyl groups similar to those mentioned above, particularly $C_{1-6}$acyl groups. Halogen atoms include fluorine, chlorine and bromine atoms. Usually, each of the substituents $R^{23}$ to $R^{26}$ is practically a hydrogen atom, a lower $C_{1-4}$alkyl group, a carboxyl group, a nitro groups, or a halogen atom.

In the formula (2), X stands for oxygen atom or hydroxyl group, and the nitrogen atom "N" and "Y" are linked by a single bond or a double bond. In the oxidation reaction, the compound shown by the formula (2) can be used either singly or in combination.

Acid anhydrides corresponding to the imide compound of the formula (2) include saturated or unsaturated aliphatic dicarboxylic acid anhydrides, such as succinic anhydride and maleic anhydride; saturated or unsaturated nonaromatic cyclic polycarboxylic acid anhydrides (alicyclic polycarboxylic acid anhydrides) such as tetrahydrophthalic anhydride, hexahydrophthalic anhydride (1,2-cyclohexanedicarboxylic acid anhydride) and 1,2,3,4-cyclohexanetetracarboxylic acid 1,2-anhydride; bridged cyclic polycarboxylic acid anhydrides (alicyclic polycarboxylic acid anhydrides) such as hetic anhydride and himic anhydride; aromatic polycarboxylic anhydrides such as phthalic anhydride, tetrabromophthalic anhydride, tetrachlorophthalic anhydride, nitrophthalic anhydride, trimellitic anhydride, methylcyclohexenetricarboxylic anhydride, pyromellitic anhydride, mellitic anhydride and 1,8;4,5-naphthalenetetracarboxylic dianhydride.

Preferred imide compounds include N-hydroxysuccinimide, N-hydroxymaleimide, N-hydroxyhexahydrophthalimide, N,N'-dihydroxycyclohexanetetracarboximide, N-hydroxyphthalimide, N-hydroxytetrabromophthalimide, N-hydroxytetrachloro-phthalimide, N-hydroxyhetimide, N-hydroxyhimimide, N-hydroxytrimellitimide, N,N'-dihydroxypyromellitimide, and N,N'-dihydroxynaphthalenetetracarboximide. Specifically preferred compounds include N-hydroxyimide compounds derived from alicyclic polycarboxylic anhydrides, particularly those derived from aromatic polycarboxylic anhydrides, such as N-hydroxyphthalimide.

The imide compound can be prepared by a conventional imidation reaction, for example, by reacting a corresponding acid anhydride with hydroxylamine $NH_2OH$ for ring-opening of the acid anhydride group, and closing the ring for imidation.

Such imide compound has high oxidation activity and is capable of catalytically accelerating or promoting the oxidation reaction of an adamantane even under mild conditions. Moreover, oxidization of a variety of substrates in the co-presence of the imide compound and a co-catalyst leads to improvements in the conversion and/or selectivity of the hydroxyl group-containing adamantane derivative.

Co-catalyst

Co-catalysts include metal compounds, e.g., compounds containing a Group 2A element of the Periodic Table of Elements (e.g., magnesium, calcium, strontium, barium), transition metal compounds, and compounds containing a Group 3B element of the Periodic Table of Elements (e.g., boron B, aluminum Al) such as boron-containing compounds. These co-catalysts may be employed independently or in combination.

Examples of a transition metal element are Group 3A elements of the Periodic Table of Elements (e.g., scandium Sc, yttrium Y, and lanthanum La, cerium Ce, samarium Sm and other lanthanoid elements, actinium Ac and other actinoid elements), Group 4A elements of the Periodic Table of Elements (e.g., titanium Ti, zirconium Zr, hafnium Hf), Group 5A elements (e.g., vanadium V, niobium Nb, tantalum Ta), Group 6A elements (e.g., chromium Cr, molybdenum Mo, tungsten W), Group 7A elements (e.g., manganese Mn, technetium Tc, rhenium Re), Group 8 elements (e.g., iron Fe, ruthenium Ru, osmium Os, cobalt Co, rhodium Rh, iridium Ir, nickel Ni, palladium Pd, platinum Pt), Group 1B elements (e.g., copper Cu, silver Ag, gold Au) and Group 2B elements (e.g., zinc Zn, cadmium Cd) of the Periodic Table of Elements.

Elements of preferred co-catalysts include transition metal elements (e.g., the Group 3A elements, the Group 4A elements, the Group 5A elements, the Group 6A elements, the Group 7A elements, the Group 8 elements, the Group 1B elements, the Group 2B elements) and the Group 3B elements (e.g., boron compounds). Particularly, when used in combination with the imide compound of the formula (2), a compound containing a Group 4A element such as Ti and Zr, a Group 5A element such as V, a Group 6A element such as Cr, Mo and W, a Group 7A element such as Mn, Tc and Re, a Group 8 element such as Fe, Ru, Co, Rh and Ni, or a Group 1B element such as Cu shows high oxidation activity.

The co-catalyst may be a metallic simple substance or a hydroxide, yet in many cases a metal oxide containing an element selected from those listed above (a double oxide or an oxygen acid salt), an organic acid salt, an inorganic acid salt, a halide, a coordinate compound (a complex) comprising a metal element selected from those listed above, a polyacid (a heteropolyacid, particularly an isopolyacid), or a salt thereof.

The valence of the element of a transition metal compound constituting the co-catalyst is not particularly limited and may be about divalent to hexavalent, and the use of a divalent transitional metal compound (e.g., a divalent cobalt compound, a divalent manganese compound) as the catalyst enhances the oxidation activity. For example, with a catalyst system comprising not a trivalent transitional metal compound but a divalent transitional metal compound in combination with the imide compound, an oxidation reaction product can be derived within a short period of time with high selectivity and high yield.

Further, the use of a compound containing at least one element selected from Group 4A elements (e.g., Ti, Zr), Group 6A elements (e.g., Cr, Mo) and Group 7A elements (e.g, Mn) of the Periodic Table of Elements as the co-catalyst significantly inhibits the deactivation of the catalyst (particularly, an imide compound) even under severe reaction conditions. Therefore, the substrate can be oxidized with oxygen or air, hence industrially advantageous.

Further, the use of a compound containing a Group 4A element (e.g., Ti, Zr), a Group 5A element (e.g., V), a Group 6A element (e.g., Cr, Mo), a Group 7A element (e.g., Mn) or a Group 8 element (e.g., Fe, Co) of the Periodic Table of Elements as the co-catalyst markedly improves the oxidation activity, leading to effective oxidation of the substrate. To give an example, a catalytic system comprised of a co-catalyst of a compound containing a Group 5A element (e.g., V), a Group 7A element (e.g., Mn), or a Group 8 element (Co) has high activity. Particularly, when a compound containing a Group 5A element (e.g., V) is employed as the co-catalyst, it is possible to oxidize a plurality of sites (particularly, a methine carbon site) and therefore provide an adamantane polyol into which a plurality of hydroxyl groups are introduced. An oxidation catalyst system comprising a combination of the imide compound (2), a compound containing a Group 7A element of the Periodic Table of Elements (e.g., a manganese compound), and a compound containing a Group 8 element of the Periodic Table of Elements (e.g., an iron compound) further improves the catalytic activity, enabling effective and efficient formation of an oxide with high conversion and selectivity. In this complex catalyst system, the proportion of the Group 8 element-containing compound (the second co-catalyst) is not particularly limited and, in many cases, about 0.1 to 25 mole (e.g., 0.1 to 20 mole), preferably about 0.2 to 15 mole, and more preferably about 0.5 to 10 mole relative to 1 mole of the Group 7A element-containing compound (the first co-catalyst).

Furthermore, an oxidation catalyst system made up of a combination of the imide compound of the formula (2) and a co-catalyst containing a Group 1B element (e.g., Cu)

largely improves the selectivity in an oxidation reaction and inhibits the deactivation of the imide compound, hence industrially advantageous.

The oxidation catalyst comprising the imide compound or the oxidation catalyst system comprising the imide compound and the co-catalyst may be whichever of a homogeneous system or a heterogeneous system. The oxidation catalyst or oxidation catalyst system may be a solid catalyst comprising a catalytic component supported on a support or carrier, as well. As the support, use can practically be made of activated carbon, zeolite, silica, silica-alumina, bentonite, and other porous supports. In the solid catalyst, regarding the amount of the catalytic component supported on the support, the amount of the imide compound of the formula (2) may be about 0.1 to 50 parts by weight, preferably about 0.5 to 30 parts by weight and more preferably about 1 to 20 parts by weight relative to 100 parts by weight of the support. The amount of the co-catalyst supported on the support is about 0.1 to 30 parts by weight, preferably about 0.5 to 25 parts by weight, and more preferably about 1 to 20 parts by weight, relative to 100 parts by weight of the support.

The proportion of the co-catalyst relative to the imide compound of the formula (2) can be selected from a range within which the reaction rate and selectivity are not adversely affected, and is about 0.001 to 10 mole, preferably about 0.005 to 5 mole, and more preferably about 0.01 to 3 mole, and usually 0.01 to 5 mole (particularly 0.001 to 1 mole) relative to 1 mole of the imide compound.

The activity of the imide compound sometimes deteriorate as the amount of the co-catalyst increases. Therefore, in order to maintain the activity of the oxidation catalytic system high, it is preferred that the proportion of the co-catalyst is, relative to 1 mole of the imide compound, in the range of from effective amount to about 0.1 mole (e.g., about 0.001 to 0.1 mole, more preferably about 0.005 to 0.08 mole, more preferably about 0.01 to 0.07 mole).

In the oxidation reaction, the amount of the imide compound of the formula (2) can be selected from a wide range and is usually about 0.0001 to 1 mole (0.01 to 100 mol %), preferably about 0.001 to 0.5 mole (0.1 to 50 mol %), more preferably about 0.01 to 0.30 mole, and in many cases about 0.01 to 0.25 mole relative to 1 mole of the substrate.

The amount of the co-catalyst (co-oxidizing agent) can also be selected from a range within which the reactivity and selectivity is not lowered, and is about 0.0001 mole (0.1 mol %) to 0.7 mole (70 mol %), preferably about 0.0001 to 0.5 mole, more preferably about 0.001 to 0.3 mole, and in many cases about 0.0005 to 0.1 mole (e.g., 0.005 to 0.1 mole) relative to 1 mole of the substrate.

When using a polyacid (e.g., an isopolyacid, a heteropolyacid) or a salt thereof as the co-catalyst, the amount of the co-catalyst is about 0.1 to 25 parts by weight, preferably about 0.5 to 10 parts by weight, and more preferably about 1 to 5 parts by weight relative to 100 parts by weight of the substrate.

Oxygen used in the oxidation of adamantanes may be active oxygen, but molecular oxygen is practically employed for economical advantages. Such molecular oxygen is not specifically limited, and pure oxygen or oxygen diluted with an inert gas such as nitrogen, helium, argon and carbon dioxide gas can be used. Air is preferably employed from the viewpoints of not only handling easiness and safety but also economy.

The amount of oxygen can be selected according to the species of the adamantane, and is usually 0.5 mole or more (e. g., 1 mole or more), preferably about 1 to 100 mole, and more preferably about 2 to 50 mole relative to 1 mole of the substrate. Oxygen is practically used in an excess mole relative to an adamantane. Particularly, the reaction is advantageously carried out in an atmosphere containing molecular oxygen such as air or oxygen gas.

Oxidation is usually effected in an organic solvent inert to the reaction. As the organic solvent, there may be mentioned, for example, organic carboxylic acids such as formic acid, acetic acid, and propionic acid; oxycarboxylic acids (or hydroxycarboxylic acids); nitrites such as acetonitrile, propionitrile and benzonitrile; amides such as formamide, acetamide, dimethylformamide (DMF) and dimethylacetamide; alcohols such as t-butanol and t-amyl alcohol; aliphatic hydrocarbons such as hexane and octane; aromatic hydrocarbons such as benzene; halogenated hydrocarbons such as chloroform, dichloromethane, dichloroethane, carbon tetrachloride and chlorobenzene; nitro compounds such as nitrobenzene, nitromethane and nitroethane; esters such as ethyl acetate and butyl acetate; ethers such as dimethyl ether, diethyl ether, diisopropyl ether, and dioxane; and mixed solvents thereof. As the solvent, in many instances, an organic acid such as acetic acid or a nitrile such as acetonitrile and benzonitrile is employed.

When the reaction is carried out in the presence of a protonic acid, the oxidation reaction proceeds smoothly and the object compound is provided with high selectivity and yield. The protonic acid can be used also as a solvent as was described above. Protonic acids include organic acids (e.g., organic carboxylic acids such as formic acid, acetic acid and propionic acid, oxalic acid, oxycarboxylic acids such as citric acid and tartaric acid, alkylsulfonic acids such as methanesulfonic acid and ethanesulfonic acid, and arylsulfonic acids such as benzenesulfonic acid and p-toluenesulfonic acid) and inorganic acids (e.g., hydrochloric acid, sulfuric acid, nitric acid, phosphoric acid).

The oxidation process using the oxidation catalyst or oxidation catalyst system is characterized in that an oxidation reaction smoothly proceeds even under relatively mild conditions. The reaction temperature can suitably be selected according to the constituent(s) of the catalytic system, and is about 0 to 300° C., preferably about 30 to 250° C., and more preferably about 50 to 200° C. Usually, a reaction is conducted at a temperature of about 70 to 150° C. When producing an adamantane polyol, at a temperature of about 40 to 150° C., particularly 60 to 120° C. (e.g., 70 to 110° C.), a reaction is prone to yield an adamantane polyol within a short period of time.

The reaction can be carried out under atmospheric pressure or applied pressure. When reacted under applied pressure, the pressure is usually about 1 to 100 atm (e.g., 1.5 to 80 atm), preferably about 2 to 70 atm, and more preferably about 5 to 50 atm. The reaction time can suitably be selected from within the range of, according to the reaction temperature and pressure, e.g., about 30 minutes to 48 hours, preferably about 1 to 36 hours, and more preferably about 2 to 24 hours.

Carboxyl Group-containing Adamantane Derivative

A carboxyl group can be introduced into an adamantane by utilizing a variety of reactions. For efficient formation of a carboxyl group, as in the oxidation reaction, carboxylation process in which an adamantane is brought into contact with carbon monoxide and oxygen in the presence of an oxidation catalyst comprised of the imide compound of the formula (2)

or an oxidation catalyst system comprised of the imide compound (2) and a co-catalyst.

Carbon monoxide or oxygen used in the carboxylating reaction may be pure and, as in the oxidation reaction, it may be diluted with an inert gas. Air can also be used as a source of oxygen.

In the carboxylating reaction, the amounts of the imide compound of the formula (2) and the co-catalyst and the ratio of the imide compound (2) to the co-catalyst can individually be selected from the ranges exemplified in the item of the oxidation reaction.

The amount of carbon monoxide used can be selected from the range of 1 mole or greater (e.g., 1 to 1,000 mole) relative to 1 mole of the substrate and is preferably an excess, for example, about 1.5 to 100 mole (e.g., 2 to 50 mole) and more preferably about 2 to 30 mole (e.g., 5 to 25 mole).

The amount of oxygen can be selected from the range of, e.g., 0.5mole or more (e.g., 0.5 to 100 mole), preferably about 0.5 to 30 mole, and more preferably about 0.5 to 25 mole, relative to 1 mole of the substrate.

The ratio of the carbon monoxide (CO) to oxygen ($O_2$) can be selected from a wide range insofar as both components are within the range mentioned above. The ratio is, for example, $Co/O_2=1/99$ to 99.99/0.01 (mol %), and carbon monoxide larger in proportion than oxygen is advantageous. The ratio of Co to $O_2$ is usually selected from the range of $CO/O_2=1/99$ to 99/1 (mol %) [e.g., 10/90 to 99/1 (mol %)], preferably about 30/70 to 98/2 (mole%), more preferably about 50/50 to 95/5 (mol %), and particularly 60/40 to 90/10 (mol %).

Moreover, the volume ratio of carbon monoxide to oxygen can be selected from the range of, e.g., $CO/O_2=1/99$ to 99.99/0.01 (volume%), and is usually in the range of about 1/99 to 99/1 (volume%), preferably 30/70 to 98/2 (volume%), more preferably about 50/50 to 95/5 (volume%), and particularly 60/40 to 90/10 (volume%).

The carboxylating reaction may be effected in an organic solvent inert to the reaction. As the organic solvent, used can be made of the oraganic solvents exemplified in the item of oxidation reaction, such as organic acids (e.g., carboxylic acids such as acetic acid), nitrites (e.g., acetonitrile), and halogenated hydrocarbons (e.g., dichloroethane).

A carboxylating reaction using the imide compound (2) smoothly proceeds even under relatively mild conditions. The reaction temperature can be selected from the range of, e.g., about 0 to 200° C., preferably about 10 to 150° C. (e.g., 10 to 120° C.), and more preferably about 10 to 100° C. (e.g., 10 to 80° C.), depending on the species of the imide compound or substrate). The reaction is carried out under atmospheric or applied pressure.

The hydroxymethyl group-containing adamantane derivative can be obtained by reducing a carboxyl group-containing adamantane derivative with hydrogen or a hydrogenation reducing agent (e.g., sodium boron hydride-Lewis acid, aluminum hydride, aluminum lithium hydride, trialkoxyaluminum lithium hydride, diborane).

Nitro Group- or Amino Group-containing Adamantanes

A nitro group can be introduced into adamantane or an adamantane having a substituent in accordance with a conventional process, e.g., a process using a nitrating agent (e.g., a mixed acid of sulfuric acid and nitric acid, nitric acid, nitric acid and an organic acid (e.g., a carboxylic acid such as acetic acid), a nitrate and sulfuric acid, dinitrogen pentaoxide). As a preferred nitrating process, there may be exemplified a nitrating process in which an adamantane is brought into contact with a nitrogen oxide in the presence or absence of an imide compound shown by the formula (2).

The nitrogen oxide may be represented by the formula $N_xO_y$, wherein x is an integer of 1 or 2, and y is an integer of from 1 to 6.

In a compound shown by the above formula, when x is 1, y is usually an integer of from 1 to 3, and when x is 2, y is usually an integer of from 1 to 6.

Such nitrogen oxides include $N_2O$, NO, $N_2O_3$, $NO_2$, $N_2O_4$, $N_2O_5$, $NO_3$, and $N_2O_6$. These nitrogen oxides can be used either independently or in combination.

Preferred nitrogen oxides include (1) a nitrogen oxide (particularly $N_2O_3$) produced by reacting at least one nitrogen-containing compound selected from dinitrogen oxide ($N_2O$) and nitrogen monoxide (NO) with oxygen, or a nitrogen oxide containing $N_2O_3$ as the main component; and (2) nitrogen dioxide ($NO_2$) or a nitrogen oxide containing $NO_2$ as the main component.

The nitrogen oxide $N_2O_3$ can easily be obtained by reacting $N_2O$ and/or NO with oxygen. To be more concrete, the nitrogen oxide $N_2O_3$ can be prepared by introducing nitrogene monoxide and oxygen into a reactor to form a blue liquid $N_2O_3$. Therefore, the nitrating reaction can be carried out by, without forming $N_2O_3$ previously, introducing $N_2O$ and/or NO and oxygen into a reaction system.

Oxygen may be pure or diluted with an inert gas (e.g., carbon dioxide, nitrogen, helium, argon). The source of oxygen may be air.

In other embodiments, when nitrogen dioxide ($NO_2$) of nitrogen oxides is used, a nitrating reaction smoothly proceeds even in the absence of oxygen. Therefore, the reaction system using $NO_2$ does not necessarily require the use of oxygen, but $NO_2$ can be used in the co-presence of oxygen.

The amount of the imide compound of the formula (2) used can be selected from a range similar to that mentioned when describing the oxygen-oxidation of the adamantane.

The amount of the nitrogen oxide depends on the amount of nitro group to introduce, and can be selected from the range of, e.g., about 1 to 50 mole, preferably about 1.5 to 30 mole, and usually about 2 to 25 mole relative to 1 mole of the adamantane.

The nitrating reaction is usually carried out in an organic solvent inert to the reaction. The organic solvent can be selected from such solvents as listed in the item of the oxidation reaction. In many cases, an organic acid (e.g., a carboxylic acid such as acetic acid), a nitrile (e.g., acetonitrile, benzonitrile) or a halogenated hydrocarbon (e.g., dichloroethane) is employed.

When a catalyst of the imide compound of the formula (2) is used, the nitrating reaction smoothly proceeds even under relatively mild conditions. The reaction temperature can be selected from the range of, e.g., about 0 to 150° C., preferably about 25 to 125° C., and more preferably about 30 to 100° C., depending on the species of the imide compound or substrate. The nitrating reaction can be effected either under atmospheric pressure or applied pressure.

An amino group-containing adamantane derivative can be formed by subjecting the nitro group-containing adamantane derivative to a reduction reaction. The reduction is carried out in accordance with a conventional method, for example, a catalytic hydrogenation method which employs hydrogen as a reducing agent, a reduction process which employs hydrogenation reducing agent, and the like.

In the catalytic hydrogenation process, a simple metal such as platinum, palladium, nickel,. cobalt, iron, and copper and a compound containing such metal element (e.g., platinum oxide, palladium black, palladium carbon, copper chromite) are available as catalyst. The amount of the catalyst used is usually about 0.02 to 1 mole relative to 1 mole of an adamantane (substrate). Moreover, in the catalytic hydrogenation process, the reaction temperature may be, e.g., −20 to 100° C. (e.g., 0 to 70° C.). The hydrogen pressure is usually 1 to 10 atm.

In the reduction process using a hydrogenation reducing agent, the hydrogenation reducing agent is, e.g., aluminum hydride, sodium boron hydride, or diborane. The amount of the hydrogenation reducing agent is usually 1 mole or more (e.g., about 1 to 10 mole) relative to 1 mole of the substrate. In the reduction process using a hydrogenation reducing agent, the reaction temperature is usually about 0 to 200° C. (e.g., 0 to 170° C.

The reduction reaction (the catalytic hydrogenation process, the process using a hydrogenation reducing agent) can be carried out in the presence of a solvent inert to the reduction reaction (e.g., the solvents exemplified in the item of the oxidation reaction, such as carboxylic acids, ethers, esters, amides).

Before, after, or in the course of the oxidation reaction, nitrating reaction, reduction reaction, or the esterification reaction, hydroxyl group, hydroxymethyl group, carboxyl group, or amino group may be protected with a protective group through a conventional operation. The protective group can be caused to leave by a conventional .method, for example, with the use an acid, an alkali, or an ion-exchange resin.

Of polymerizable adamantane derivatives (1a) and adamantane derivatives (1c), compounds having a basic group or an acidic group may form salts. For example, a carboxyl group-containing adamantane derivative forms a salt by being reacted with an organic base or inorganic base. An amino group-containing adamantane derivative forms a salt by being reacted with an inorganic acid or organic acid.

The reaction such as oxidation can be carried out in any of batch, semi-batch, and continuous systems. After completion of the reaction, the reaction product can easily be separated and purified through a conventional procedure, e.g., through a separation step such as filtration, condensation, distillation, extraction, crystallization, recrystallization, and column chromatography, or by a combination means thereof.

INDUSTRIAL APPLICABILITY

The photoresist resin composition of the present invention can be solubilized by irradiation with light and is useful in forming minute patterns. Moreover, the photoresist resin composition comprises an adamantane skeleton and thus is highly resistant to etching. Although its formula (make-up) is simple, minute patterns can be formed therefrom with precision and accuracy.

EXAMPLES

Hereinafter, the present invention will be described in further detail with reference to Examples and Comparative Examples but should by no means be construed as defining the present invention.

Example 1

(1) Hydroxylation

A mixture of 10 mmol of adamantane, 2 mmol of N-hydroxyphthalimide (NHPI), 0.1 mmol of vanadiumacetylacetonato V(AA)$_3$ and 25 ml of acetic acid was stirred in an atmosphere of oxygen at 85° C. for 10 hours, and there were formed, with a conversion of adamantane of 99%, 1-adamantanol (yield: 8%), 1,3-adamantanediol (yield: 22%), 1,3,5-adamantanetriol (yield: 33%), and 1,3,5,7-adamantanetetraol (yield: 20%).

(2) Introduction of an Acryloyl Group and a Protective Group 10 mmol of 1,3,5-adamantanetriol, 10 mmol of triethylamine, and 40 ml of tetrahydrofuran were mixed, and 10 mmol of acrylic acid chloride was added dropwise to this mixture for about 30 minutes. After completion of the dropwise addition, the mixture was stirred at room temperature for 6 hours. After the reaction had been completed, to the reaction mixture was added water and the resultant mixture was purified by column chromatography to give 1-acryloyloxy-3,5-dihydroxyadamantane.

To 30 ml of tetrahydrofuran were added 5 mmol of 1-acryloyloxy-3,5-dihydroxyadamantane and 15 mmol of acetoaldehyde and 1 mmol of p-toluenesulfonic acid, and the mixture was stirred at 30° C. for 6 hours. Then, the reaction mixture was condensed under acidic conditions and crystallized by adding dropwise to diethyl ether to give the object compound 1-acryloyloxy-3,5-di(1-hydroxyethoxy)adamantane (acetal compound).

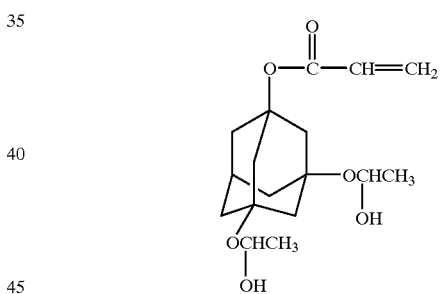

(3) Polymerization 100 parts by weight of a monomer mixture comprised of 50% by weight of the obtained 1-acryloyloxy-3,5-di(1-hydroxyethoxy)adamantane (actalized compound), 10% by weight of methyl methacrylate, 20% by weight of butyl acrylate, and 20% by weight of methacrylic acid was polymerized in an organic solvent (toluene) using 5 parts by weight of a polymerization initiator (benzoyl peroxide). Then, methanol was added to the mixture to precipitate the polymer. The step of dissolution in toluene and precipitation with methanol was repeated for purification thereby to give a copolymer having a weight average molecular weight of about 1.5×10$^4$ (molecular weight on polystyrene basis according to GPC).

Example 2

10 mmol of 1,3,5-adamantanetriol, 10 mmol of triethylamine, and 40 ml of tetrahydrofuran were mixed, and 10 mmol of methacrylic acid chloride was added dropwise to the mixture for about 30 minutes. After completion of the dropwise addition, the mixture was stirred at room temperature for 24 hours. After the reaction had been completed, to the reaction mixture was added water, followed by purification by column chromatography to give 1-methacryloyloxy-3,5-dihydroxyadamantane.

To 30 ml of tetrahydrofuran were added 5 mmol of 1-methacryloyloxy-3,5-dihydroxyadamantane, 15 mmol of acetoaldehyde, and 1 mmol of p-toluenesulfonic acid, and the mixture was stirred at 30° C. for 6 hours. The reaction mixture was condensed under acidic conditions and crystallized by adding to diethyl ether dropwise to give the object compound 1-methacryloyloxy-3,5-di(1-hydroxyethoxy) adamantane (acetal compound) represented by the following formula:

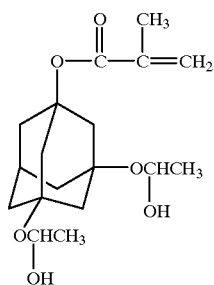

Except for the use of the obtained 1-methacryloyloxy-3, 5-di(1-hydroxyethoxy)adamantane (acetal compound) instead of 1-acryloyloxy-3,5-di(1-hydroxyethoxy) adamantane (acetal compound), polymerization was carried out in the same manner as of the polymerization in Example 1, and there was formed a copolymer.

Example 3

(1) Carboxylation 10 mmol of 1,3,5-adamantanetriol, 1 mmol of NHPI, 0.005 mmol of Co(AA)$_2$ were added to 25 ml of acetic acid, and the mixture was stirred at 60° C. for 6 hours in a reactor with a gas pack inflated with a mixed gas (mixed gas: 2 L of carbon monoxide adn 0.5 L of oxygen; pressure: 5 kg/cm$^2$) connected thereto. As a result, with a conversion of 1,3,5-adamantanetriol of 99%, there was obtained 1-carboxy-3,5,7-adamantanetriol (yield: 80%).

(2) Esterification and Introduction of a Protective Group 1 mmol of 1-carboxy-3,5,7-adamantanetriol and 2.5 mmol of 2-hydroxyethyl acrylate were reacted in toluene to give 1-acryloyloxyethoxycarbonyl-3,5,7-adamantanetriol. To 30 ml of tetrahydrofuran were added 5 mmol of 1-acryloyloxyethoxycarbonyl-3,5,7-adamantanetriol, 25 mmol of acetoaldehyde, and 1 mmol of p-toluenesulfonic acid, and the mixture was acetalized in the same manner as in Example 1 to give the object compound 1-acryloyloxyethoxycarbonyl-3,5,7-tri(1-hydroxyethoxy) adamantane (actalilzed compound) shown by the following formula.

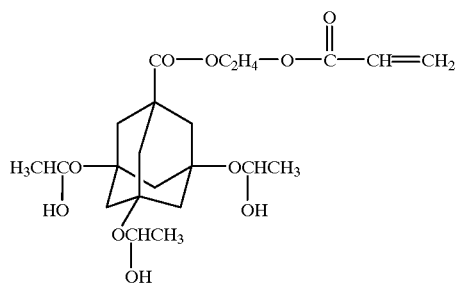

(3) Polymerization

Except for the use of 1-acryloyloxyethoxycarbonyl-3,5,7-tri(1-hydroxyethoxy)adamantane instead of 1-acryloyloxy-3,5-di(1-hydroxyethoxy)adamantane, a copolymer was formed in the same manner as of the polymerization in Example 1.

Example 4

(1) Hydroxymethylation

5 In an atmosphere of nitrogen, 15 mmol of aluminum lithium hydride was suspended in 15 ml of tetrahydrofuran (THF). Thereafter, 10 mmol of 1-carboxy-3,5,7-adamantanetriol was gradually added to the mixture while keeping the temperature of the mixture at 10° C. or lower by using ice bath. After the temperature of the mixture had been brought back to room temperature, the mixture was refluxed for 16 hours, giving 1-hydroxymethyl-3,5,7-adamantanetriol.

(2) Esterification and Introduction of a Protective Group

Except for the use of 1-hydroxymethyl-3,5, 7adamantanetriol instead of 1,3,5-adamantanetriol, 1-acryloyloxymethyl-3,5,7-tri(1-hydroxyethoxy) adamantane of the following formula was formed in the same manner as of the esterification and introduction of a protective group in Example 1.

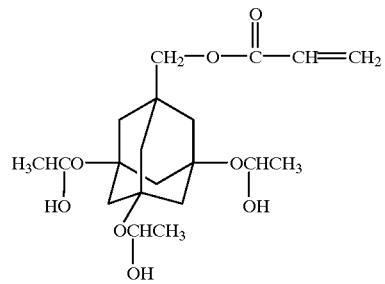

(3) Polymerization

Except for the use of 1-acryloyloxymethyl-3,5,7 -tri(1-hydroxyethoxy)adamantane instead of 1-acryloyloxy-3,5-di (1-hydroxyethoxy)adamantane, a copolymer was formed in the same manner as of the polymerization in Example 1.

Example 5

(1) Carboxylation

Except for the use of adamantane instead of 1,3,5-adamantanetriol, 1,3-dicarboxyadamantane was formed in the same manner as of the carboxylation (1) in Example 3.

(2) Introduction of a Protective Group and Hydroxylation

In accordance with a conventional method in which isobutene is used under acidic conditions, 10 mmol of 1,3-dicarboxyadamantane was t-butoxylated to give 1,3-di(t-butoxycarbonyl)adamantane.

A mixture of 10 mmol of the obtained 1.3-di(t-butoxycarbonyl)adamantane, 2 mmol of NHPI, 0.1 mmol of acetylacetonatocobalt Co(AA)$_2$, and 25 ml of acetic acid was stirred in an atmosphere of oxygen at 75° C. for 6 hours. As a result, there was obtained 1,3-di(t-butoxycarbonyl)-5-hydroxyadamantane.

(3) Esterification

Except that 1,3-di(t-butoxycarbonyl)-5-hydroxyadamantane in lieu of 1,3,5-adamantanetriol was reacted with acrylic acid chloride, 1,3-di(t-butoxycarbonyl)-5-acryloyloxyadamantane represented by the following formula was obtained in the same manner as of the esterification in Example 1.

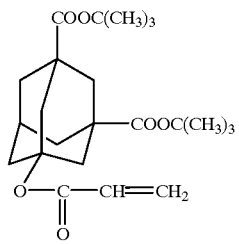

(4) Polymerization

Except for the use of the obtained 1,3-di(t-butoxycarbonyl)-5-acryloyloxyadamantane instead of 1-acryloyloxy-3,5-di(1-hydroxyethoxy)adamantane (acetal compound), a copolymer was formed in the same manner as of the polymerization in Example 1.

Example 6

Except for the use of methacrylic acid chloride instead of acrylic chloride, 1,3-di(t-butoxycarbonyl)-5-methacryloyloxyadamantane represented by the following formula was formed in the same manner as of the esterification in Example 5.

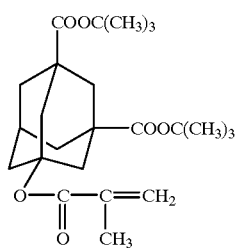

(4) Polymerization

Except for the use of the obtained 1,3-di(t-butoxycarbonyl)-5-methacryloyloxyadamantane instead of 1-acryloyloxy-3,5-di(1-hydroxyethoxy)adamantane (acetal compound), a copolymer was formed in the same manner as of the polymerization in Example 1.

Example 7

(1) Carboxylation

Except for the use of 1,3-adamantanediol instead of 1,3,5-adamantanetriol, 1,3-dihydroxy-5-carboxyadamantane was formed in the same manner as of the carboxylation (1) in Example 3.

(2) Introduction of an Acryloyl Group

Except for the use of 1,3-dihydroxy-5-carboxyadamantane instead of 1,3,5-adamantanetriol, 1-acryloyloxy-3-hydroxy-5-carboxyadamantane was formed in the same manner as of the introduction of an acryloyl group (2) in Example 1.

(3) Esterification and Introduction of a Protective Group 1-acryloyloxy-3-hydroxy-5-t-butoxycarbonyladamantane represented by the following formula was formed by, as in the introduction of a protective group in Example 5, t-butoxylating 1-acryloyloxy-3-hydroxy-5-carboxyadamantane with isobutene under acidic conditions.

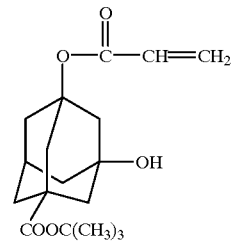

(4) Polymerization

A 10 weight % solution was prepared by dissolving 95 parts by weight of 1-acryloyloxy-3-hydroxy-5-t-butoxycarbonyladamantane and 5 parts by weight of azobisisobutyronitrile (AIBN) in dimethylformamide (DMF). The solution was heated at 60° C. for 5 hours for polymerization, and the polymer was precipitated by using methanol. The obtained polymer was purified by reprecipitation with methanol to give a polymer with a weight average molecular weight of about 15,000.

Example 8

(1) Carboxylation

Except for the use of 1-adamantanol instead of 1,3,5-adamantanetriol, 1-hydroxy-3,5-dicarboxyadamantane was formed in the same manner as of the carboxylation (1) in Example 3.

(2) Introduction of an Acryloyl Group

Except for the use of 1-hydroxy-3,5-dicarboxyadamantane instead of 1,3,5-adamantanetriol, 1-acryloyloxy-3,5-dicarboxyadamantane was formed in the same manner as of the introduction of an acryloyl group (2) in Example 1.

(3) Esterification and Introduction of a Protective Group

As in the introduction of a protective group in Example 5, 1-acryloyloxy-3-carboxy-5-t-butoxycarbonyladamantane represented by the following formula was formed by the t-butoxylation of 1-acryloyloxy-3,5-dicarboxyadamantane with isobutene under acidic conditions.

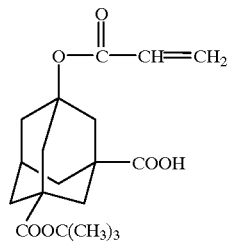

(4) Polymerization

The obtained 1-acryloyloxy-3-carboxy-5-t-butoxycarbonyladamantane was polymerized in the same manner as of the polymerization in Example 7 to give a polymer having a weight average molecular weight of about 22,000.

Example 9

(1) Acetalization and Introduction of a Protective Group

Except for the use of 5 mmol of 1-acryloyloxy-3,5-dihyroxyadamantane and 7 mmol of acetoaldehyde, 1-acryloyloxy-3-hydroxy-5-(1-hydroxyethoxy)adamantane (acetal compound) represented by the following formula was obtained in the same manner as of the introduction of a protective group in Example 1.

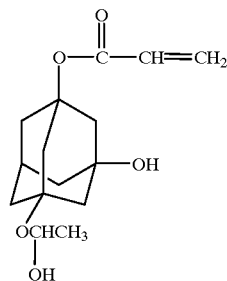

(2) Polymerization

The obtained 1-acryloyloxy-3-hydroxy-5-(1-hydroxyethoxy)adamantane was polymerized in the same manner as of the polymerization in Example 7 to give a polymer having a weight average molecular weight of about 13,000.

Example 10

(1) Polymerization

Except for the use of 1,3-adamantanediol instead of 1,3,5-adamantanetriol, 1-acryloyloxy-3-hydroxyadamantane was formed in the same manner as in Example 1. A monomer mixture of 50 mol % of 1-acryloyloxy-3-hydroxyadamantane obtained above and 50 mol % of 1,3-di(t-butoxycarbonyl)-5-acryloyloxyadamantane obtained in Example 5 was polymerized in the same manner as of the polymerization in Example 7 to give a copolymer having a weight average molecular weight of about 11,000 and the following units:

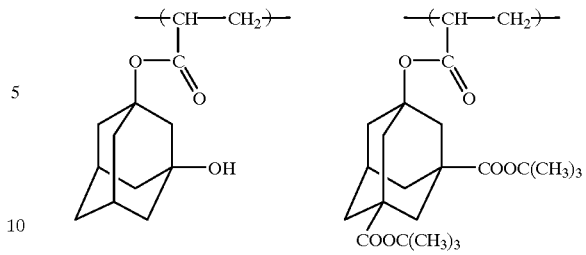

Example 11

(1) Polymerization

A monomer mixture of 50 mol % of 1-acryloyloxy-3,5-dihydroxyadamantane obtained in Example 1 and 50 mol % of 1, 3-di(t-butoxycarbonyl) -5-acryloyloxyadamantane obtained in Example 5 was polymerized in the same manner as of the polymerization in Example 7 to give a copolymer having a weight average molecular weight of about 8,000 and the following units:

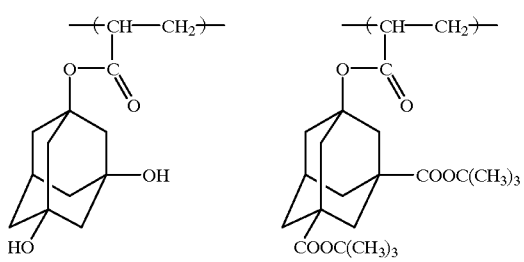

Example 12

(1) Polymerization

A monomer mixture of 50 mol % of 1-acryloyloxy-3-hydroxyadamantane obtained in the same manner as in Example 1 and 50 mol % of 1-acryloyloxy-3-(t-butoxycarbonyl)adamantane obtained in the same manner as in Example 5 was polymerized in the same manner as of the polymerization in Example 7 to give a copolymer having a weight average molecular weight of about 10,000 and the following units:

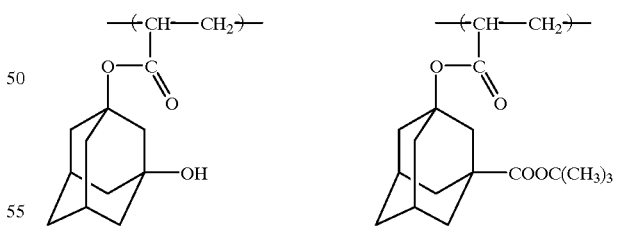

Example 13

(1) Hydroxylation

Except for the use of 1,3-dimethyladamantane instead of adamantane, 1,3,-dimethyl-5,7-dihyroxyadamantane was formed in the same manner as of the hydroxylation in Example 1.

(2) Introduction of an Acryloyl Group

Except for the use of 1,3-dimethyl-5,7-dihydroxyadamantane instead of 1,3,5-adamantanetriol, 1-acryloyloxy-3-hydroxy-5,7-dimethyladamantane was formed in 5 the same manner as of the introduction of an acryloyl group in Example 1.

(3) Carboxylation

Except for the use of 1,3-dimethyladamantane instead of 1,3,5-adamantanetriol, 1,3-dimethyl-5-carboxy-adamantane was formed in the same manner as of the carboxylation (1) in Example 3.

(4) Intoruduction of a Protective Group and Hydroxylation

Except for the use of 1,3-dimethyl-5-carboxyadamantane instead of 1,3-dicarboxyadamantane, 1,3-dimethyl-5-carboxy-7-hydroxyadamantane was formed in the same manner as of the introduction of a protective group and hydroxylation in Example 4. 1,3-dimethyl-5-(t-butoxycarbonyl)-7-hydroxyadamantane was obtained from the 1,3-dimethyl-5-carboxy-7-hydroxyadamatane in the same manner as of the introduction of a protective group and hydroxylation in Example 4.

(5) Acryloylation

Except for the use of 1,3-dimethyl-5-(t-butoxycarbonyl)-7-hydroxyadamantane instead of 1,3,5-adamantanetriol, 1,3-dimethyl-5-(t-butoxycarbonyl)-7-acryloyloxyadamantane was formed in the same manner as of the introduction of an acryloyloxy group in Example 1.

(6) Polymerization

A monomer mixture of 40 mol % of the obtained 1-acryloyloxy-3-hydroxy-5,7-dimethyladamantane and 60 mol % of 1,3-dimethyl-5-(t-butoxycarbonyl)-7-acryloyloxyadamantane was polymerized in the same manner as of the polymerization in Example 7 to give a copolymer having a weight average molecular weight of about 7,000 and the following units:

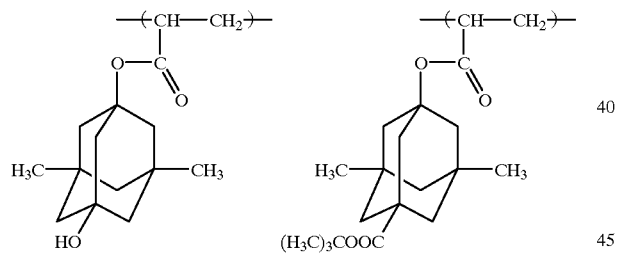

Photoresist Resin Composition 100 parts by weight of the polymer each obtained in Examples 1 to 13 and 10 parts by weight of triphenylsulfoniumhexafluoroantimony were mixed with a solvent [dimethylformamide (DMF)] to prepare a photoresist resin composition containing a polymer at a concentration of 17% by weight. The photoresist resin composition so obtained was applied to a silicon wafer by spin coating to form a photosensitive layer of 1.0 μm thick. After the photosensitive layer was prebaked on a hot plate at 100° C. for 150 seconds, the layer was exposed to light, in an irradiation amount suitably selected from the range of 5 to 50 mJ/cm according to the species of the polymer, through a mask using KrF excimer laser having a wavelength of 247 nm. Thereafter, each exposed layer was postbaked at 100° C. for 60 seconds, developed with 0.3 mol/L of an aqueous tetramethylammoniumhydroxide solution for 60 seconds, and rinsed with pure water. As a result, there was provided a 0.5 μm line-and-space pattern.

What is claimed is:

1. A photoresist compound represented by the following formula (1a):

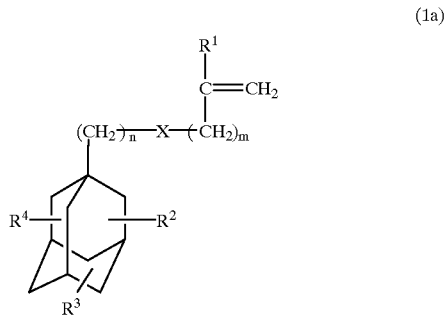

(1a)

wherein $R^1$ represents a hydrogen atom or a methyl group; $R^2$, $R^3$, and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, or a hydroxymethyl group by elimination with an acid; at least one of the groups $R^2$ to $R^4$ is the functional group; X represents a connecting group; and m and n individually represent 0 or 1.

2. A photoresist compound according to claim 1, wherein X is an ester bond.

3. A photoresist compound represented by the following formula (1a):

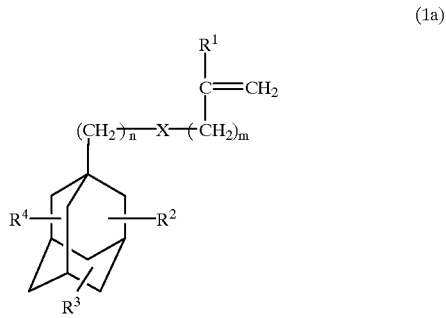

(1a)

wherein $R^1$ represents a hydrogen atom or a methyl group; $R^2$, $R^3$, and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, a hydroxymethyl group or a carboxyl group by elimination with an acid; at least one of the groups $R^2$ to $R^4$ is the functional group; X represents a connecting group; and m and n individually represent 0 or 1, wherein at least two of the substituents $R^2$ to $R^4$ are selected from the group consisting of hydroxyl group, hydroxymethyl group, carboxyl group and a functional group.

4. A photoresist compound represented by the following formula (1a):

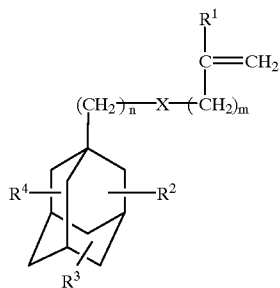

(1a)

wherein $R^1$ represents a hydrogen atom or a methyl group; $R^2$, $R^3$, and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, a hydroxymethyl group or a carboxyl group by elimination with an acid; at least one of the groups $R^2$ to $R^4$ is the functional group; X represents a connecting group; and m and n individually represent 0 or 1, wherein at least two of the substituents $R^2$ to $R^4$ are groups selected from the group consisting of hydroxyl group, an alkoxy group, hydroxyl group protected by acetalization or hemiacetalization, carboxyl group, and alkoxycarbonyl group; and these two substituents are different from each other.

5. A photoresist resin composition comprising a polymer having a unit shown by the following formula (1):

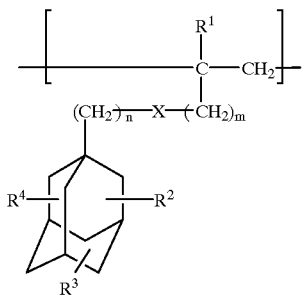

(1)

wherein $R^1$ represents a hydrogen atom or a methyl group; $R^2$, $R^3$, and $R^4$ are the same or different from each other, each representing a hydrogen atom, a halogen atom, an alkyl group, a nitro group, an amino group, an N-substituted amino group, a hydroxyl group, a hydroxymethyl group, a carboxyl group, or a functional group which forms a hydroxyl group, or a hydroxymethyl group by elimination with an acid; at least one of $R^2$ to $R^4$ is the functional group; X represents a connecting group; and m and n individually represent 0 or 1 and a photoactive acid precursor.

6. A photoresist resin composition according to claim 5, wherein the polymer is a copolymer of the compound recited in claim 1 and a copolymerizable monomer which is copolymerizable with the compound.

7. A photoresist resin composition according to claim 5, which comprises 0.1 to 30 parts by weight of the photoactive acid precursor relative to 100 parts by weight of the polymer having a unit represented by the formula (1).

8. A method for forming a pattern, which comprises pattern-exposing a coating layer comprising a photoresist resin composition recited in claim 5 formed on a substrate and developing the exposed coating layer to form a pattern.

* * * * *